United States Patent [19]

Yen et al.

[11] Patent Number: 4,513,261
[45] Date of Patent: Apr. 23, 1985

[54] LOW-LOSS ACOUSTIC WAVE FILTER DEVICE

[75] Inventors: Kuo-Hsiung Yen, Manhattan Beach; Robert B. Stokes, Torrance; Kei-Fung Lau, Harbor City; Alvin M. Kong; Reynold S. Kagiwada, both of Los Angeles, all of Calif.

[73] Assignee: TRW Inc., Redondo Beach, Calif.

[21] Appl. No.: 493,917

[22] Filed: May 12, 1983

[51] Int. Cl.$^3$ .................... H03H 9/145; H03H 9/64
[52] U.S. Cl. .................... 333/194; 310/313 C; 333/151; 333/154; 333/196
[58] Field of Search .................... 333/150–155, 333/193–196; 310/313 R, 313 A, 313 C, 313 D; 29/25.35; 358/36, 38, 167, 904, 905

[56] References Cited

U.S. PATENT DOCUMENTS

| | | | |
|---|---|---|---|
| 3,859,608 | 1/1975 | Hartmann et al. | 333/195 |
| 3,908,137 | 9/1975 | Hunsinger et al. | 310/313 D |
| 4,044,321 | 8/1977 | Vasile | 310/313 C |
| 4,237,432 | 12/1980 | Huang et al. | 333/194 |

Primary Examiner—Marvin L. Nussbaum
Attorney, Agent, or Firm—Noel F. Heal; Robert M. Wallace

[57] ABSTRACT

An acoustic wave filter device with low loss and low passband ripple characteristics. The filter comprises three bidirectional electroacoustical transducers disposed along a common axis on the surface of a substrate of piezoelectric material. The two outer transducers of the three function as input transducers and the center transducer functions as an output transducer. One of the input transducers is of the antisymmetric type and has a transfer characteristic that differs in phase angle by ninety degrees with respect to the other input transducer, which is of the symmetric type. This ninety-degree difference applies at all frequencies, so that any energy reflected from the output transducer and again reflected by an input transducer will be subject to a phase shift of 180 degrees in the case of energy reflected from the antisymmetric input transducer, and no phase shift in the case of the symmetric input transducer. Accordingly, these triple-transit echoes will cancel at the output transducer, for all frequencies. For the primary energy propagation from the input transducers to the output transducer, a ninety-degree phase shifter in one input circuit ensures that the signals from the two input transducers are in phase when they reach the output transducer.

9 Claims, 5 Drawing Figures

LOW-LOSS ACOUSTIC WAVE FILTER DEVICE

BACKGROUND OF THE INVENTION

This invention relates generally to surface acoustic wave (SAW) devices and shallow bulk acoustic wave (SBAW) devices, and more particularly, to low-loss SAW and SBAW filters. Such devices are useful in a variety of applications, including communication systems.

Piezoelectric crystal devices utilizing surface acoustic waves, as contrasted with bulk acoustic waves, have been developed over the last several years. The SAW devices have a number of important advantages over bulk acoustic wave devices, including a higher frequency of operation, and a planar structure that is easy to fabricate and is mechanically rugged.

More recently, another acoustic wave device has been developed, and is sometimes referred to as the shallow bulk acoustic wave (SBAW) device. In this type of device, acoustic waves are propagated at a relatively shallow angle just below the surface of a piezoelectric crystal. A higher velocity of propagation is obtained than in SAW devices, and correspondingly higher frequencies of operation are possible. Alternatively, transducer finger spacings may be made larger for any given frequency. In addition, SBAW devices are less sensitive to surface contamination than SAW devices, and are less responsive to spurious signals of the bulk or SAW type. SBAW devices are described more fully in U.S. Pat. No. 4,349,794 issued in the names of Reynold S. Kagiwada et al.

Acoustic wave devices of both the SAW type and the SBAW type utilize interdigital transducers for converting electrical energy into acoustic or mechanical energy, and vice versa. Basically, these transducers comprise metalized layers formed on the crystal surface in finger-like configurations, like the teeth of a comb. The finger-like elements are usually arranged in two sets, with the fingers in the two sets extending in opposite directions, in an interleaved fashion, from respective elongated pads, known as sum bars.

When an electrical signal is applied to such a transducer, across the sum bars of the two sets of fingers, an acoustic wave is launched in a direction perpendicular to the transducer fingers. Depending on the type of crystal, the crystal cut, and the relative orientation of the transducers, the acoustic wave will be either a surface wave, or a shallow bulk wave, or a combination of the two types. When the acoustic wave encounters a second, similarly structured transducer, it is transformed back into an electricl signal for output from the device. Typically, a transmitting or input transducer in such a device is excited by an oscillatory electrical signal, either in continuous-wave (CW) mode, or in a pulsed mode of operation.

The frequency of operation of SAW and SBAW devices depends largely on the size and geometry of the transducers. Although an electroacoustical transducer will convert an input electrical signal to an acoustic wave of the same frequency, the transducer has a high insertion loss at frequencies outside a band of frequencies determined by the transducer geometry. The transducer operates, in effect, like a bandpass filter, the center frequency of which is determined by the spacing between pairs of transducer fingers, and the pass-band width of which is controllable to some degree by the number of pairs of fingers in the transducer. In general, a transducer with many pairs of fingers will have a narrow-band frequency response, while one with few pairs of fingers will have a wideband frequency response.

A conventional SAW filter device of the type described has an insertion loss of approximately 10–20 decibels (dB), which is too high for many applications of such devices. One reason that the losses are so high is that each transducer is a bidirectional element. When an electrical signal is applied to a conventional interdigital transducer, acoustic waves are launched in two opposite directions. Recently, two different unidirectional types of low-loss SAW filters have been developed with insertion losses of close to 5 dB. The two types, of which the disadvantages will be discussed in more detail, are referred to as the three-phase unidirectional transducer filter and the group-type unidirectional transducer filter.

A three-phase unidirectional transducer comprises three interlaced interdigital transducers to which three phase-spaced input signals are applied. For example, an unshifted input signal is applied to one transducer, the same input signal shifted by 120 degrees is applied to the second transducer, and the same input signal shifted by 240 degrees is applied to the third transducer. The three transducers are aligned on a common axis and are spaced apart to provide a desired reinforcement and cancellation of their acoustic outputs. More specifically, the outputs of the three transducers are in phase in one direction away from the composite set of transducers, but cancel each other in the opposite direction. A similar three-phase transducer is needed to perform the output function. Three-phase transducers not only require the use of 120-degree phase-shifting networks, but also necessitate the use of an airgap crossover to make appropriate connections to the three transducers. This effectively limits the device to lower frequencies, in a range below 500 megahertz (MHz). Another drawback is that the three-phase transducer is difficult to amplitude-weight. It will also be apparent that the three-phase transducer is truly unidirectional only for a particular frequency, since the spacing of the three transducers has to be chosen as a function of wavelength, to obtain the desired reinforcement and cancellation of the signals.

A related approach is the group type unidirectional transducer (GUDT), which uses two interlaced transducers to which input signals are applied ninety degrees out of phase with each other. The spacing between the transducers is such that the acoustic signals from the two reinforce in one direction and cancel in the other. A similar GUDT is used for output purposes. Again, the unidirectional effect is limited to a narrow frequency band, and the GUDT is therefore limited to filter applications requiring higher shape factors and moderate out-of-band rejection. The GUDT is also difficult to amplitude-weight, and requires a meandering ground path to be fabricated on the device.

Yet another approach is to use three bidirectional transducers, arranged along a common axis. When an input signal is applied to the two outer transducers, the overall bidirectional loss is theoretically limited to one half, or 3 dB, since the input energy is split equally at each of the two outer transducers, and one half of the energy is propagated away from the group of three transducers. Ideally, the center transducer receives equal wavefronts from both directions, and the total incident energy may be extracted without significant loss. In practice, however, the center transducer cannot be perfectly matched over the passband of the device, and some of the energy incident on the center transducer is reflected back to the outer transducers. Some of this reflected energy is, in turn, reflected from the outer transducers back to the center transducer again, where it may be transduced into electrical form. This effect is referred to as a triple-transit echo. It manifests itself as a significant passband ripple on the frequency characteristic of the device.

One technique that has been suggested for suppression of the triple-transit echo inherent in the three-transducer approach is to offset one of the outer transducers by one quarter-wavelength with respect to the other, so that there will be a ninety-degree phase difference between the two paths to the center transducer. The signal applied to one of the two outer transducers is also shifted in phase by ninety degrees, to compensate for the offset. Thus, the two primary acoustic signals will arrive at the center transducer exactly in phase, as in the original configuration of the three-transducer filter. However, the signals reflected from the center transducer will subsequently be subject to differing phase shifts. Because of the ninety-degree offset spacing of one of the outer transducers, signals making a triple transit of the device will cancel on return to the center transducer. Unfortunately, this triple-transit suppression technique works effectively only for a single frequency, which is usually selected to be the center frequency of the filter. For most practical filter applications, the triple-transit problem remains and a passband ripple in excess of 1 dB is present in the frequency response.

It will be appreciated from the foregoing that there is still a need for a low-loss acoustic wave filter device that avoids the drawbacks of the prior art. In particular, there is a need for a low-loss acoustic wave device operable over a wide range of frequencies and having having no significant passband ripple in its frequency characteristic. The present invention fulfills this need.

SUMMARY OF THE INVENTION

The present invention resides in low-loss acoustic wave filter with low passband ripple. Basically, and in general terms, the filter of the invention comprises two outer transducers to which an input signal is applied, and a central transducer from which an output signal is obtained, all three transducers being bidirectional. Alternatively, an input signal may be applied to the central transducer, and an output signal obtained from the outer transducers. Importantly, one of the outer transducers has an antisymmetric finger polarity sequence, and the other is symmetric. The two outer transducers are spaced equally from the center transducer, but the difference in symmetry causes the transfer functions of the two to differ by ninety degrees at all frequencies. The filter also includes means for shifting the phase of the input signal applied to one of the outer transducers by ninety degrees, such that acoustical signals arriving at the center transducer will be in phase. Signals reflected from the center transducer in both directions will also be in phase, but will be 180 degrees out of phase after reflection from the outer transducers and upon reaching the center transducer for the second time. This is because the signal reflected toward the antisymmetric transducer will be subject to a total phase shift of 180 degrees upon reflection back to the center, while the signal reflected toward the symmetric transducer will not.

The filter of the invention not only has low losses and low passband ripple, but it has the advantages of being operable at any practical SAW bandwidth, on any piezoelectric material, and in SBAW devices as well as SAW devices. The transducers can be amplitude-weighted by apodizaction or finger withdrawal as desired. Furthermore, multiple devices can be cascaded to obtain greater out-of-band rejection, and will also work effectively at a harmonic frequency. Finally, the simple geometry of the device, with no airgap crossovers or meander paths, facilitates design and fabrication. Other aspects and advantages of the invention will become apparent from the following more detailed description, taken in conjunction with the accompanying drawings.

DESCRIPTION OF THE PREFERRED EMBODIMENT

Figure 1:
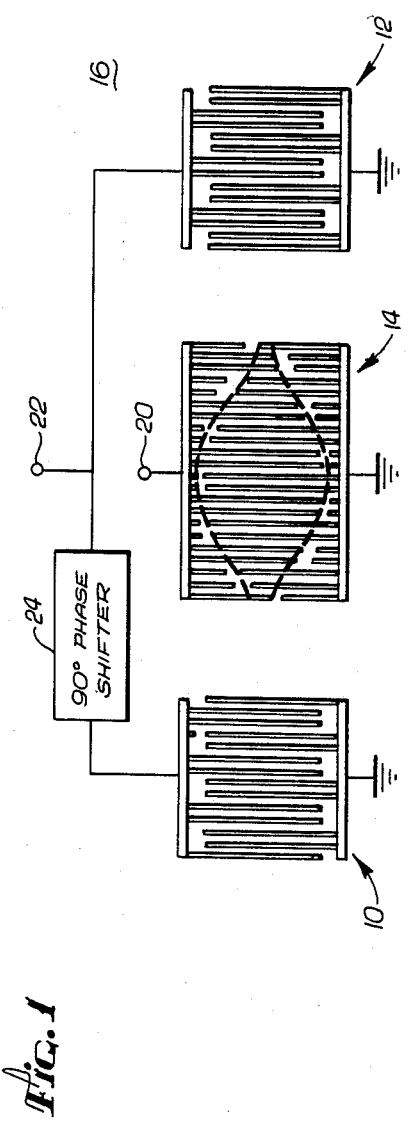
FIG. 1 is a diagrammatic plan view of the filter of the invention.

As shown in the drawings for purposes of illustration, the present invention is concerned with acoustic wave devices configured to operate as low-loss filters. In the past, low-loss acoustic wave filters have used three-phase unidirectional tranducers, or group type unidirectional transducers, or have used a three-transducer configuration that suffers from a triple-transit echo problem.

In accordance with the invention, a low-loss acoustic wave filter is obtained with a three-transducer configuration comprising two outer transducers for signal input, indicated by generally by reference numerals 10 and 12, respectively, and a central transducer 14 for signal output. The three transducers 10, 12 and 14 are bidirectional interdigital transducers and are aligned along a common axis on a piezoelectric crystal 16, the outer transducers being spaced at equal distances from the central transducer. The crystal 16 and the orientation of the transducers with respect to the axes of the crystal are selected to provide a desired mode of operation, i.e. surface acoustic wave (SAW) mode or a shallow bulk acoustic wave (SBAW) mode.

Importantly, one of the outer transducers 10 has an antisymmetric finger polarity, while the other 12 is symmetrical. The difference in symmetry makes for a difference in transfer functions of ninety degrees of phase angle for all frequencies. In the illustrative embodiment, the outer transducers 10 and 12 are Hamming-weighted using finger withdrawal, and the center transducer 14 is symmetric and apodized, also with Hamming weighting. One sum bar of each of the transducers is grounded. The other sum bar of the center transducer 14 is connected to an output terminal 20.

The other sum bar of transducer 12 is connected to an input terminal 22, while the other sum bar of transducer 10 is connected to the same input terminal through a ninety-degree phase shift circuit 24.

An input signal applied to the input terminal 22 will be phase-shifted ninety degrees by the phase shift circuit 24, then ninety degrees in the opposite direction by the antisymmetric transducer 10. Thus the output transducer 14 will receive signals from the two input transducers 10 and 12 in phase, and most of the energy will be extracted by the output transducer. A signal reflected from the center transducer 14 to the symmetric transducer 12 and back to the center transducer again, will be subject to no phase shift, but one reflected from the center transducer to the antisymmetric transducer 10 and back to the center transducer again, will be subject to two ninety-degree phase shifts. Consequently, these triple-transit echoes will cancel on being received again at the center transducer 14, and this cancellation effect will be operative at all frequencies, rather than just at the center frequency of the filter.

Figure 2:
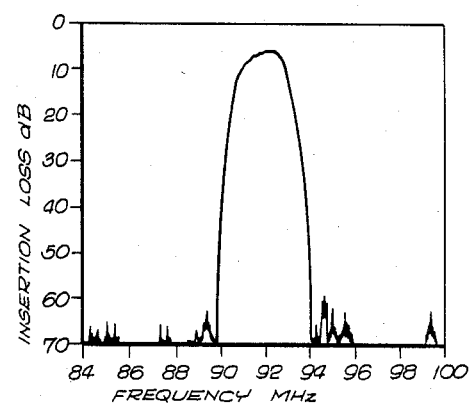
FIG. 2 is a graph showing the frequency response characteristic of a SAW filter made in accordance with the invention on a substrate of 128-degree rotated Y-cut, X-propagating lithium niobate ($LiNbO_3$)
Figure 3:
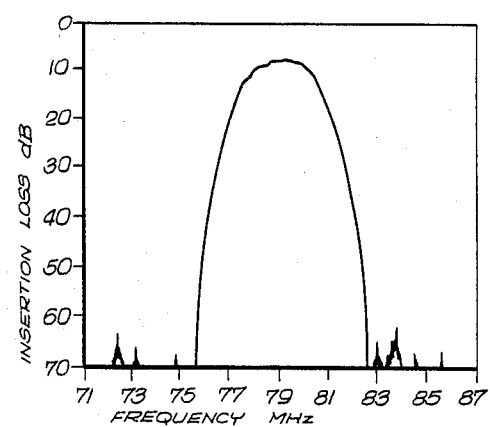
FIG. 3 is a graph showing the frequency response characteristic of a SAW filter made in accordance with the invention on a substrate of MDC lithium tantalate ($LiTaO_3$)

FIG. 2 shows the frequency response of the filter constructed as a SAW device on 128-degree rotated Y-cut, X-propagating $LiNbO_3$. The insertion loss is approximately 5.2 dB, of which 3 dB is due to bidirectional loss of the outer transducers 10 and 12, 0.8 dB is due to apodization loss of the center transducer 14, and the remainder due to mismatch and resistivity losses. The out-of-band rejection is greater than 50 dB and the passband ripple 0.3 dB peak to peak. FIG. 3 shows the frequency response of the same filter constructed on a substrate of MDC $LiTaO_3$. The insertion loss is approximately 8 dB and the passband ripple is only 0.15 dB peak to peak.

Figure 4:
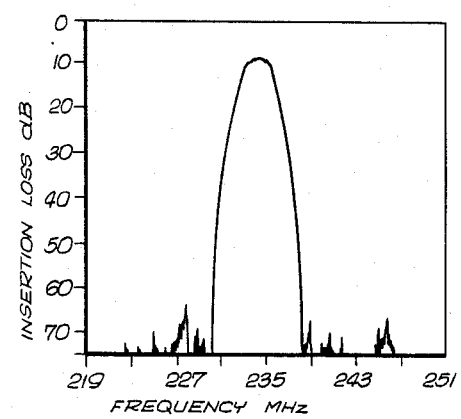
FIG. 4 is a graph similar to FIG. 3, but showing the third-harmonic frequency response.

Because the illustrative filter uses split finger transducers, a strong third harmonic frequency response can be obtained, as shown in FIG. 4. The insertion for the third harmonic is approximately 9 dB, the passband ripple is 0.25 dB, and the out-of-band rejection is greater than 55 dB.

Figure 5:
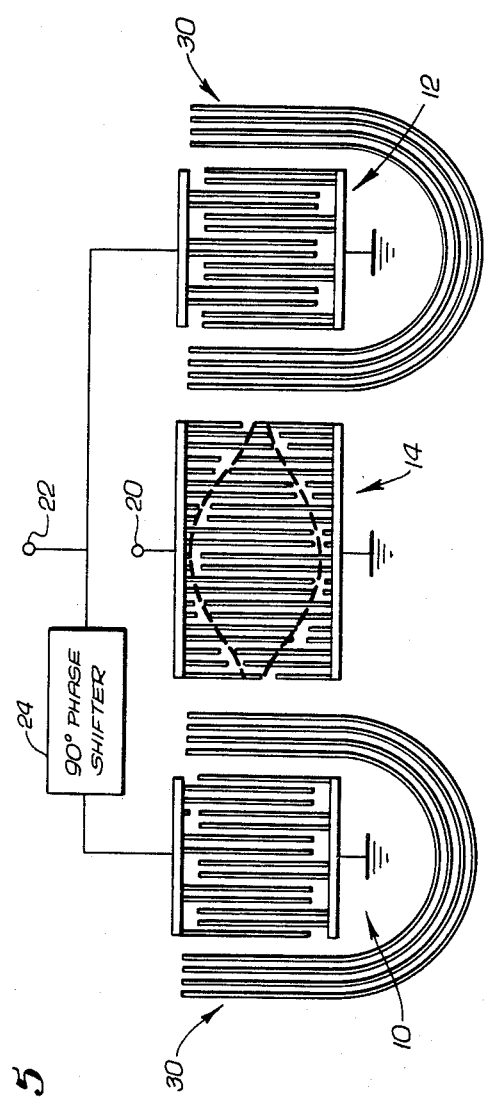
FIG. 5 is a view similar to FIG. 1, but showing the use of U-shaped couplers to further reduce losses.

When the substrate used is a material of high electromechanical coupling coefficient, such as $LiNbO_3$, two U-shaped multistrip couplers 30 can be added to the basic three-transducer configuration, as shown in FIG. 5, to eliminate the 3 dB losses at the outer transducers 10 and 12. The U-shaped couplers 30 modify the mode of operation of the outer transducers, which then function as unidirectional instead of bidirectional devices.

It will be appreciated from the foregoing that the present invention represents a significant advance in the field of acoustic wave filter devices. In particular, the filter of the invention not only has low losses, but has a low passband ripple component in the frequency response of the device. In addition, the device will work at any practical SAW frequency, and for SBAW as well as SAW modes of operation. The input and output transducers can be weighted by apodization or finger withdrawal, and multiple devices can be cascaded for increased out-of-band rejection. A further advantage is that the device will work at a higher harmonic frequency if a multi-electrode transducer is used. Finally, the simple geometry of the device makes it easy to design, fabricate, package and match.

It will be appreciated that, although a specific embodiment of the invention has been described in detail by way of illustration, various modifications may be made without departing from the spirit and scope of the invention. For example, the principle of the invention is equally valid when the central transducer is used for signal input and the outer transducers for signal output. Accordingly, the invention is not to be limited except as by the appended claims.

We claim:

1. An acoustic wave filter comprising:
   a substrate of piezoelectric material;
   a symmetric electroacoustic output transducer disposed on said substrate;
   a pair of electroacoustic input transducers disposed on said substrate at equal distances on opposite sides of said output transducer, one of said input transducers being symmetric and the other being antisymmetric, the two having transfer functions that differ by a ninety-degree angle and having an aperture substantially equal to that of the output transducer; and
   ninety-degree phase shifting means coupled to one of said input transducers, to compensate for the ninety-degree phase shift introduced by said antisymmetric input transducer;
   whereby signals reflected from said output transducer to said antisymmetric input transducer and back again will return with a 180-degree phase shift and will thereby cancel signals reflected from said output transducer to said symmetric input transducer and back again, and whereby the cancellation effect is relatively independent of frequency.

2. An acoustic wave filter as set forth in claim 1, and further including:
   two U-shaped multistrip couplers each positioned to surround one of said input transducers, to further reduce losses by causing said input transducers to function as unidirectional devices.

3. An acoustic wave filter as set forth in claim 1, wherein:
   said transducers are amplitude-weighted to provide a desired frequency response characteristic.

4. An acoustic wave filter, comprising:
   a substrate of piezoelectric material;
   an electroacoustic interdigital transducer disposed on said substrate and serving as an output transducer;
   a pair of electroacoustic interdigital transducers serving as an output transducer;
   a pair of electroacoustic interdigital transducers serving as input transducers and disposed on said substrate at equal distances on opposite sides of said output transducer, with the transducer fingers of said three transducers parallel to each other and with said three transducers aligned on a common axis and having substantially the same aperture; and
   ninety-degree phase shifting means coupled to one of said input transducers;
   wherein one of said input transducers is symmetric and the other is antisymmetric, the two having transfer functions that differ by a ninety-degree phase angle, and wherein said ninety-degree phase shifting means compensates for the phase shift introduced by said antisymmetric transducer and ensures that signals from both of said input transducers reach said output transducer with the same phase angle;
   and whereby signals reflected from said output transducer to said antisymmetric input transducer and back again will return with a 180-degree phase shift and will thereby cancel signals reflected from said output transducer to said symmetric input transducer and back again, and the cancellation effect is relatively independent of frequency.

5. An acoustic wave filter as set forth in claim 4, and further including:
two U-shaped multistrip couplers each positioned to surround one of said input transducers, to further reduce losses by causing said input transducers to function as unidirectional devices.

6. An acoustic wave filter as set forth in claim 4, wherein:
said transducers are amplitude-weighted to provide a desired frequency response characteristic.

7. An acoustic wave filter comprising:
a substrate of piezoelectric material;
a symmetric electroacoustic input transducer disposed on said substrate;
a pair of electroacoustic output transducers disposed on said substrate at equal distances on opposite sides of said input transducer, one of said output transducers being symmetric and the other being antisymmetric, the two having transfer functions that differ by a ninety-degree phase angle and having an aperture substantially equal to that of said input transducer; and
ninety-degree phase shifting means coupled to one of said output transducers, to compensate for the ninety-degree phase shift introduced by said antisymmetric output transducer;
whereby signals reflected from said antisymmetric output transducer to said input transducer and back again be subject to a 180-degree phase shift and will thereby cancel signals reflected from said symmetric output transducer to said input transducer and back again.

8. An acoustic wave filter as set forth in claim 7, and further including:
two U-shaped multistrip couplers each positioned to surround one of said output transducers, to further reduce losses by causing said output transducers to function as unidirectional devices.

9. An acoustic wave filter as set forth in claim 7, wherein:
said transducers are amplitude-weighted to provide a desired frequency response characteristic.

* * * * *